United States Patent
Liu et al.

(10) Patent No.: US 10,469,070 B1
(45) Date of Patent: Nov. 5, 2019

(54) PAM-4 VOLTAGE-MODE DRIVER WITH STABILIZED OUTPUT

(71) Applicant: Marvell International Ltd., Hamilton (BM)

(72) Inventors: Peng Liu, Fremont, CA (US); Zhendong Guo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/133,456

(22) Filed: Sep. 17, 2018

Related U.S. Application Data

(60) Provisional application No. 62/559,359, filed on Sep. 15, 2017.

(51) Int. Cl.

| | | |
|---|---|---|
| H03K 17/16 | (2006.01) | |
| H03K 7/02 | (2006.01) | |
| H03K 17/60 | (2006.01) | |
| H03K 17/10 | (2006.01) | |
| H03K 19/177 | (2006.01) | |
| H03K 19/00 | (2006.01) | |
| H03K 17/693 | (2006.01) | |
| H03K 17/62 | (2006.01) | |

(52) U.S. Cl.
CPC ............... *H03K 17/10* (2013.01); *H03K 7/02* (2013.01); *H03K 17/60* (2013.01); *H03K 17/6242* (2013.01); *H03K 17/693* (2013.01); *H03K 19/0021* (2013.01); *H03K 19/17784* (2013.01)

(58) Field of Classification Search
CPC . H04L 25/0282; H04L 25/0272; H04L 25/08; H04L 25/03878; H04L 25/03006; H04L 25/4906; H04L 27/02; H04L 27/08; H03K 19/018528; H03K 17/687; H03K 17/693; H03K 19/017509; H03K 3/012; H03K 7/02; H03K 17/6871; H04B 3/32
See application file for complete search history.

(56) References Cited

U.S. PATENT DOCUMENTS

| | | | |
|---|---|---|---|
| 7,193,467 B2 * | 3/2007 | Garlepp | H03F 3/45183 330/253 |
| 7,528,629 B2 * | 5/2009 | Farjadrad | H04L 25/028 326/86 |
| 8,508,252 B2 * | 8/2013 | Farjadrad | H04L 25/0264 326/30 |
| 9,699,009 B1 * | 7/2017 | Ainspan | H04L 25/4917 |
| 9,746,864 B1 * | 8/2017 | Narang | G05F 1/56 |
| 9,847,839 B2 * | 12/2017 | Gopalakrishnan | H04L 25/49 |
| 9,853,642 B1 * | 12/2017 | Tan | H03K 19/018521 |
| 9,887,710 B1 * | 2/2018 | Lim | H03M 9/00 |

(Continued)

*Primary Examiner* — Vibol Tan

(57) ABSTRACT

Linearity of a PAM-4 voltage-mode driver is improved using current compensation. The driver receives a first input data signal having a first logic level and a second input data signal having a second logic level. In an additive current mode, when the first logic level matches the second logic level, the driver uses switch circuitry to form an auxiliary current path through which supplementary current (I_Supplementary) flows from a voltage regulator. In a primary current mode, when the first logic level does not match the second logic level, the driver uses the switch circuitry to break the auxiliary current path, thereby preventing the supplementary current (I_Supplementary) from flowing from the voltage regulator.

20 Claims, 5 Drawing Sheets

(56) References Cited

U.S. PATENT DOCUMENTS

| | | | |
|---|---|---|---|
| 10,044,377 B1* | 8/2018 | Chong | H04B 1/04 |
| 10,218,444 B2* | 2/2019 | Gopalakrishnan | H04L 25/49 |
| 2019/0044768 A1* | 2/2019 | Kim | H04L 27/04 |

* cited by examiner

| Mode | DMSB | DLSB | DMSB+ | DMSB- | DLSB+ | DLSB- | Switch 1 | Switch 2 | Switch 3 | Switch 4 | I_Primary | I_Supp. | I_Total |
|---|---|---|---|---|---|---|---|---|---|---|---|---|---|
| 1 | 0 | 0 | -1 | +1 | -1 | +1 | Open | Closed | Open | Closed | $I_1$ | $I_2-I_1$ | $I_2$ |
| 2 | 0 | 1 | -1 | +1 | +1 | -1 | Open | Closed | Closed | Open | $I_2$ | 0 | $I_2$ |
| 2 | 1 | 0 | +1 | -1 | -1 | +1 | Closed | Open | Open | Closed | $I_2$ | 0 | $I_2$ |
| 1 | 1 | 1 | +1 | -1 | +1 | -1 | Closed | Open | Closed | Open | $I_1$ | $I_2-I_1$ | $I_2$ |

PAM-4 VOLTAGE-MODE DRIVER WITH STABILIZED OUTPUT

CROSS-REFERENCE TO RELATED APPLICATION

This claims the benefit under 35 U.S.C. § 119(e) of commonly assigned U.S. Provisional Patent Application No. 62/559,359, filed Sep. 15, 2017, which is hereby incorporated by reference herein in its entirety.

FIELD OF USE

This disclosure relates to four-level pulse amplitude modulation (PAM-4) driver circuitry, and specifically, to systems and methods for improving the linearity of a PAM-4 voltage-mode driver by stabilizing its regulator output using current compensation.

BACKGROUND OF THE DISCLOSURE

The background description provided herein is for the purpose of generally presenting the context of the disclosure. Work of the inventors hereof, to the extent the work is described in this background section, as well as aspects of the description that do not otherwise qualify as prior art at the time of filing, are neither expressly nor impliedly admitted to be prior art against the present disclosure.

Recently, the use of multi-level signaling, such as PAM-4 signaling, has been gaining favor over binary non-return-to-zero (NRZ) signaling in high speed physical layer transceiver circuit applications for transmitting bit streams of digital data. Generally, this is because PAM-4 multi-level signaling packs more bits into a given amount of time on a serial channel in comparison to NRZ signaling. Multi-level PAM-4 signaling, thus, is desirable for use in some high data-rate (e.g., 56 Gbps) serial interfaces. High data-rate serial interface standards, however, typically require a PAM-4 multi-level voltage-mode driver circuit to satisfy a strict linearity requirement, for example, with respect to voltage levels representing different combinations of bits. To satisfy such a strict linearity requirement, a PAM-4 voltage-mode driver circuit, for instance for PAM-4, must have its regulator output voltage maintained at a relatively constant level. Conventionally, the uniformity of output voltage is obtained using a current mode driver or off-chip charge capacitors.

SUMMARY

Linearity of a PAM-4 voltage-mode driver is improved using current compensation. In one aspect, a pulse amplitude modulated-4 (PAM-4) voltage mode driver is provided in which a resistance of a primary current path of the driver varies as a function of respective logic levels of digital data that is input to the driver. The voltage-mode driver includes switch circuitry that is coupled to a first input port and a second input port and that is responsive to respective binary logic levels of a first input data signal input to the first and the second input data signal. The switch circuitry is configured to: (1) in response to the first logic level matching the second logic level, cause supplementary current (I_Supplementary) to flow from a voltage regulator through the auxiliary current path in an additive current mode, and (2) in response to the first logic level not matching the second logic level, prevent the supplementary current (I_Supplementary) from flowing from the voltage regulator through the auxiliary current path in a primary current mode.

In some aspects, the first input data signal includes a first positive polarity input data signal and a first negative polarity input data signal, and the second input data signal includes a second positive polarity input data signal and a second negative polarity input data signal. The first differential digital input data port includes a first positive terminal and a first negative terminal configured to receive the first positive polarity input data signal and the first negative polarity input data signal, respectively. The second differential digital input data port includes a second positive terminal and a second negative terminal configured to receive the second positive polarity input data signal and the second negative polarity input data signal, respectively.

In another aspect, the switch circuitry includes first, second, third, and fourth switches. The first switch is coupled to the first positive terminal and configured to receive the first positive polarity input data signal. The second switch is coupled to the first negative terminal and configured to receive the first negative polarity input data signal. The third switch is coupled to the second positive terminal and configured to receive the second positive polarity input data signal. The fourth switch is coupled to the second negative terminal and configured to receive the second negative polarity input data signal. The first switch is coupled in series to the third switch, and the second switch is coupled in series to the fourth switch. The switch circuitry is configured to cause, in the additive current mode, supplementary current (I_Supplementary) to flow from the voltage regulator through the auxiliary current path by (1) closing the first switch and the third switch and opening the second switch and the fourth switch, or (2) closing the second switch and the fourth switch and opening the first switch and the third switch.

In yet another aspect, the switch circuitry is configured to prevent, in the primary current mode, the supplementary current (I_Supplementary) from flowing from the voltage regulator through the auxiliary current path by (1) closing the first switch and the fourth switch and opening the second switch and the third switch, thus breaking a path from the voltage regulator to ground through any of the first switch, second switch, third switch, or fourth switch, or (2) closing the second switch and the third switch and opening the first switch and the fourth switch, thus breaking a path from the voltage regulator to ground through any of the first switch, second switch, third switch, or fourth switch.

In still another aspect, the first switch, the second switch, the third switch, and the fourth switch respectively include transistors.

In some embodiments, the first logic level is deemed to match the second logic level in the additive current mode when: (1) both the first logic level and the second logic level are at a logical high or (2) both the first logic level and the second logic level are at a logical low, and the first logic level is deemed to not match the second logic level in the primary current mode when (1) the first logic level is at a logical low and the second logic level is at a logical high or (2) the first logic level is at a logical high and the second logic level is at a logical low.

In some aspects, the auxiliary current path has one or more resistors collectively having a resistance that corresponds to a difference between the first resistance and the second resistance, thereby causing the supplementary current (I_Supplementary) to be equal to a difference between the first amount of current and the second amount of current, within a tolerance amount.

In another aspect, the auxiliary current circuitry further includes multiple resistors and corresponding resistor switches that are configured to selectively engage the resistors, and the PAM-4 voltage-mode driver further includes control circuitry coupled to the resistor switches and configured to engage a selectable quantity of resistors to set a resistance of the auxiliary current path to match a difference between a resistance formed on the primary current path during the additive current mode and a resistance formed on the primary current path in the primary current mode.

In yet another aspect, the selectively engaging the resistors includes engaging one or more of the resistors to increase the resistance of the auxiliary current path and decrease the supplementary current (I_Supplementary), or disengaging one or more of the resistors to decrease the resistance of the auxiliary current path and increase the supplementary current (I_Supplementary).

In some embodiments, the PAM-4 voltage-mode driver further includes a first primary current path; and a second primary current path. The first primary current path includes two first transistors and has a first resistance and is activated in a first mode in response to the first logic level matching the second logic level. The second primary current path includes a first sub-path comprising two second transistors and a second sub-path comprising two third transistors, and has a second resistance and is activated in a second mode in response to the first logic level not matching the second logic level. The first resistance is greater than the second resistance, thereby causing the driver circuitry to draw a first amount of current from the voltage regulator in the first mode and draw a second amount of current from the voltage regulator in the second mode, the first amount of current being less than the second amount of current.

In accordance with another aspect, a method for using current compensation to improve the linearity of a pulse amplitude modulated-4 (PAM-4) voltage mode driver, in which a resistance of a primary current path of the driver varies as a function of respective logic levels of digital data that is input to the driver, is provided. The method includes receiving, at a first differential digital input data port of PAM-4 driver circuitry, a first input data signal having a first logic level. A second input data signal having a second logic level is received at a second differential digital input data port of the driver circuitry. In an additive current mode, in response to the first logic level matching the second logic level, switch circuitry is used to form an auxiliary current path, thereby causing supplementary current (I_Supplementary) to flow from the voltage regulator through the auxiliary current path. In a primary current mode, in response to the first logic level not matching the second logic level, the switch circuitry is used to break the auxiliary current path, thereby preventing the supplementary current (I_Supplementary) from flowing from the voltage regulator through the auxiliary current path.

In some aspects, the receiving the first input data signal at the first differential digital input data port includes receiving a first positive polarity input data signal and a first negative polarity input data signal of the first input data signal via a first positive terminal and a first negative terminal, respectively. The receiving the second input data signal at the second differential digital input data port includes receiving a second positive polarity input data signal and a second negative polarity input data signal of the second input data signal via the second positive terminal and the second negative terminal, respectively.

In another aspect, the method further includes: (1) receiving the first positive polarity input data signal at a first switch coupled to the first positive terminal; (2) receiving the first negative polarity input data signal at the second switch coupled to the first negative terminal; (3) receiving the second positive polarity input data signal at the third switch coupled to the second positive terminal; and (4) receiving the second negative polarity input data signal at the fourth switch coupled to the second negative terminal, the first switch being coupled in series to the third switch, and the second switch being coupled in series to the fourth switch. The using switch circuitry to cause the supplementary current (I_Supplementary) to flow from the voltage regulator through the auxiliary current path of the driver includes: (1) closing the first switch and the third switch and opening the second switch and the fourth switch, or (2) closing the second switch and the fourth switch and opening the first switch and the third switch.

In still another aspect, the method further includes: (1) receiving the first positive polarity input data signal at a first switch coupled to the first positive terminal; (2) receiving the first negative polarity input data signal at the second switch coupled to the first negative terminal; (3) receiving the second positive polarity input data signal at the third switch coupled to the second positive terminal; and (4) receiving the second negative polarity input data signal at the fourth switch coupled to the second negative terminal, the first switch being coupled in series to the third switch, and the second switch being coupled in series to the fourth switch. The using the switch circuitry to prevent the supplementary current (I_Supplementary) from flowing from the voltage regulator through the auxiliary current path comprises: (1) closing the first switch and the fourth switch and opening the second switch and the third switch, thus breaking a path from the voltage regulator to ground through any of the first switch, second switch, third switch, or fourth switch, or (2) closing the second switch and the third switch and opening the first switch and the fourth switch, thus breaking a path from the voltage regulator to ground through any of the first switch, second switch, third switch, or fourth switch.

In some aspects, the using switch circuitry to form an auxiliary current path includes selectively switching transistors from an on-mode conducting current therethrough and an off-mode preventing current from being conducted therethrough.

In a further aspect, the determining that the first logic level matches the second logic level includes determining that: (1) both the first logic level and the second logic level are at a logical high or (2) both the first logic level and the second logic level are at a logical low, and the determining that the first logic level does not match the second logic level includes determining that: (1) the first logic level is at a logical low and the second logic level is at a logical high or (2) the first logic level is at a logical high and the second logic level is at a logical low.

In another aspect, the method further includes selectively engaging in the auxiliary current path one or more resistors collectively having a resistance that corresponds to a difference between the first resistance and the second resistance, thereby causing the supplementary current (I_Supplementary) to be equal to a difference between the first amount of current and the second amount of current, within a tolerance amount.

In yet another aspect, the method further includes selectively engaging a resistance of the auxiliary current path by engaging a selectable quantity of resistors to set a resistance of the auxiliary current path to match a difference between a resistance formed on the primary current path during the additive current mode and a resistance formed on the primary current path in the primary current mode.

In some embodiments, the selectively engaging the resistors includes engaging one or more of the resistors to increase the resistance of the auxiliary current path and decrease the supplementary current (I_Supplementary), or disengaging one or more of the resistors to decrease the resistance of the auxiliary current path and increase the supplementary current (I_Supplementary).

In still another embodiment, the method further includes: (1) activating, in the additive current mode, a first primary current path including two first transistors and having a first resistance; and (2) activating, in the primary current mode, a second primary current path including a first sub-path including two second transistors and a second sub-path including two third transistors, and having a second resistance. The first resistance is greater than the second resistance, thereby causing a first amount of current to be drawn from the voltage regulator in the additive current mode and a second amount of current to be drawn from the voltage regulator in the primary current mode, the first amount of current being less than the second amount of current.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which:

FIG. 4 is a table illustrating examples of data input values, switch states, and current amounts for different modes, in accordance with the present disclosure.

DETAILED DESCRIPTION

Figure 1:
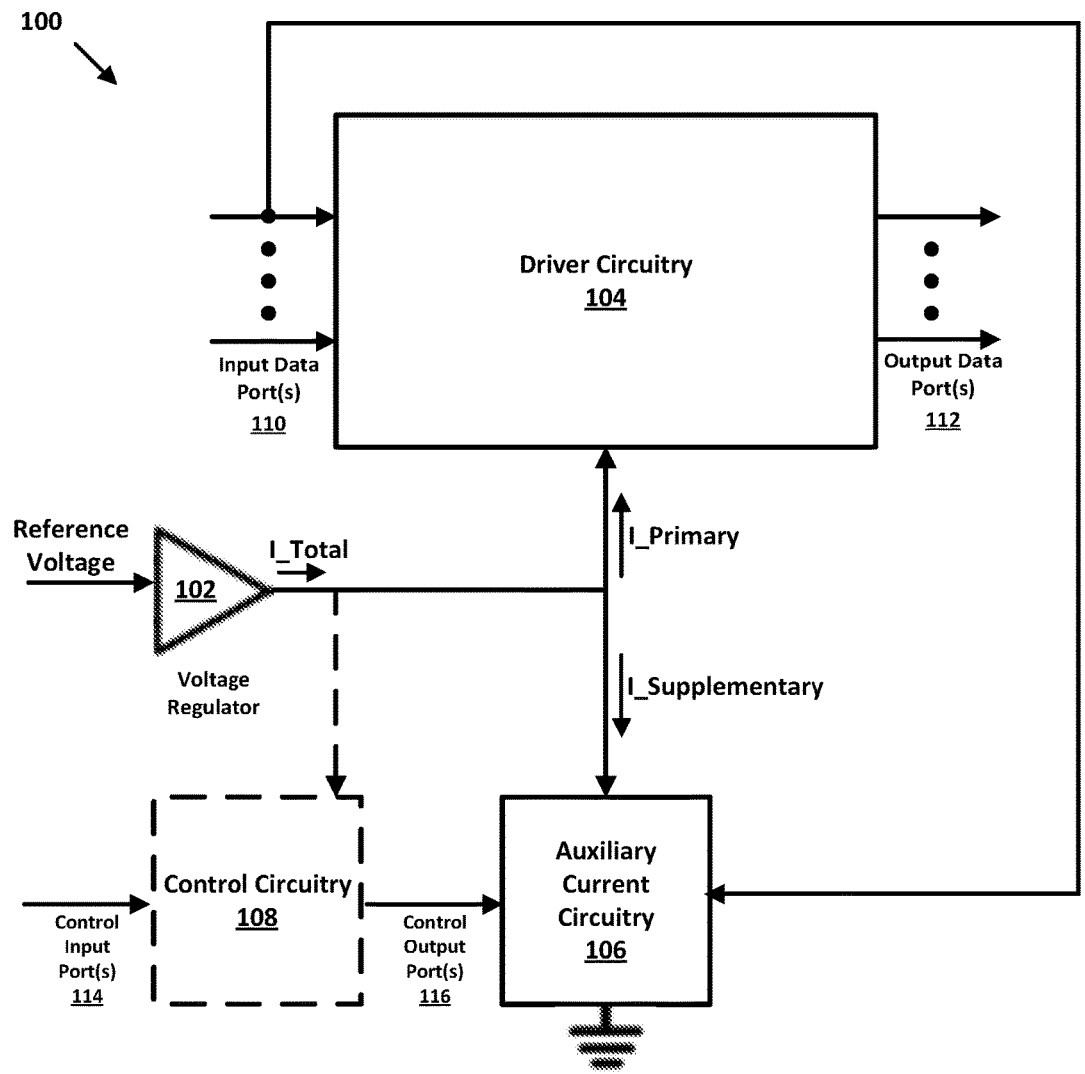
FIG. 1 is a representation of a PAM-4 voltage mode driver in accordance with some embodiments of the subject matter of this disclosure.

A PAM-4 voltage-mode driver circuit, in some embodiments, receives two differential digital input signals in which a first signal provides a most significant bit (DMSB, having complementary signals DMSB+ and DMSB−), and a second signal provides a least significant bit (DLSB, having complementary signals DLSB+ and DLSB−). Based on the received signals, the driver circuit outputs a voltage signal at one of four voltage levels according to the values of the respective digital input signals. That is, for each of the four possible digital input values (e.g., 00, 01, 10, and 11), the PAM-4 driver circuit outputs a corresponding one of four possible output voltage values (e.g., $V_1$, $V_2$, $V_3$, and $V_4$).

Unlike with NRZ signaling, a conventional PAM-4 voltage-mode driver circuit consumes different amounts of DC current from its voltage regulator for certain of the four output voltage levels. For example, depending on component values and the like, the PAM-4 driver draws one amount of DC current (e.g., 5 mA) from its voltage regulator when the digital input value is either 00 or 11, and draws a different amount of DC current (e.g., 10 mA) from its voltage regulator when the digital input value is either 01 or 10.

The aforementioned variation in current draw causes a corresponding regulator output voltage variation and degrades signal linearity of the PAM-4 driver. For a PAM-4 voltage-mode driver circuit to comply with high data-rate (e.g., 56 Gbps) serial interface standards, the PAM-4 driver circuit must satisfy a stringent linearity requirement. To do so, the regulator output voltage of the PAM-4 driver circuit must be maintained relatively constant.

In order to improve the linearity of a PAM-4 voltage-mode driver and render the driver compliant, and suitable for use, with high data-rate serial interface standards, embodiments of the subject matter of this disclosure provide a PAM-4 voltage-mode driver that, in response to digital input signals, utilizes current compensation to stabilize its regulator output. Specifically, the systems and methods provided herein utilize an auxiliary current path, dynamically enabled based on the data values present at the digital input ports of the driver, to ensure that a similar amount of DC current is drawn from the regulator for all four possible digital input signal values (and output voltage levels) of the PAM-4 voltage-mode driver.

Non-linearity in PAM-4 driver circuitry can make it difficult for a PAM-4 receiver circuitry to resolve a logic level (e.g., a voltage) of a data bit communicated by that driver via a serial interface. Non-linearity in a PAM-4 driver thus gives rise to increased errors in the communication of data bits via the serial interface, and an increased bit error rate (BER) for the PAM-4 driver. One approach in compensating for such communication errors is to employ error detection and/or error correction. However, error detection and/or error correction sometimes requires the retransmission of data that was communicated in error, which decreases the effective data rate of the PAM-4 driver.

By improving the linearity of a PAM-4 voltage-mode driver, the embodiments of the subject matter of this disclosure enable a PAM-4 receiver to more easily and reliably resolve the logic levels of data bits communicated by the PAM-4 driver via a serial interface. This mitigates the aforementioned errors in the communication of bits and decreases the BER of the PAM-4 driver without the aforementioned decreasing of the data rate of the PAM-4 driver.

One approach for improving the linearity of PAM-4 voltage-mode driver circuitry has been to add large capacitors to the PAM-4 voltage-mode driver. Because capacitors that are large enough to improve the linearity of a PAM-4 driver circuitry are too large to implement on-chip. Consequently, such an approach has the drawback of requiring greater circuit board real estate than implementing an on-chip solution. The embodiments of the subject matter of this disclosure improve the linearity of a PAM-4 voltage-mode driver by way of an on-chip solution, thereby requiring less circuit board real estate than an off-chip capacitor-based solution.

Another approach for solving the linearity of PAM-4 drivers is the use of a current mode driver. Although conventional PAM-4 current-mode drivers do not exhibit non-linearity as severe as conventional PAM-4 voltage-mode drivers exhibit, PAM-4 current-mode drivers consume more power than consumed by PAM-4 voltage-mode drivers. Therefore, in applications where minimal power utilization is desirable, it is preferable to employ a PAM-4 voltage-mode driver that exhibits improved linearity in accordance with the subject matter of this disclosure, over a conventional PAM-4 current-mode driver.

FIG. 1 is a block diagram illustrating a PAM-4 voltage mode driver 100 with current compensation for improved linearity, according to some embodiments described herein. The driver 100 includes a voltage regulator 102, driver circuitry 104, auxiliary current circuitry 106, and optionally control circuitry 108. The voltage regulator 102 receives a reference voltage and provides regulated power (e.g., voltage and current) to the driver circuitry 104 and, in some modes, to the auxiliary current circuitry. In embodiments of the driver 100 that include the control circuitry 108, having control input port(s) 114 and control output port(s) 116, the voltage regulator 102 also provides power to the optional control circuitry 108. The driver circuitry 104 includes data input ports 110 and data output ports 112, and receives digital input data signals via the data input ports 110 and performs PAM-4 modulation on the digital input data signals to generate a corresponding PAM-4-modulated output signal, which is provided by way one of the data output ports 112. Whereas, at any given time, each of the individual data input ports 110 can have one of two possible logical states, the PAM-4-modulated output signal can have one of four possible voltage levels.

The auxiliary current circuitry 106 is coupled to the data input ports 110. As described in further detail elsewhere herein, the auxiliary current circuitry 106 includes an auxiliary current path (not separately shown in FIG. 1) that, based upon the values of the digital input signals present at the data input ports 110, dynamically toggles between two modes—an additive current mode in which supplementary current (I_Supplementary) is permitted to flow from the voltage regulator 102 through the auxiliary current path, and a primary current mode in which supplementary current (I_Supplementary) is prevented from flowing from the voltage regulator 102 through the auxiliary current path.

Figure 2:
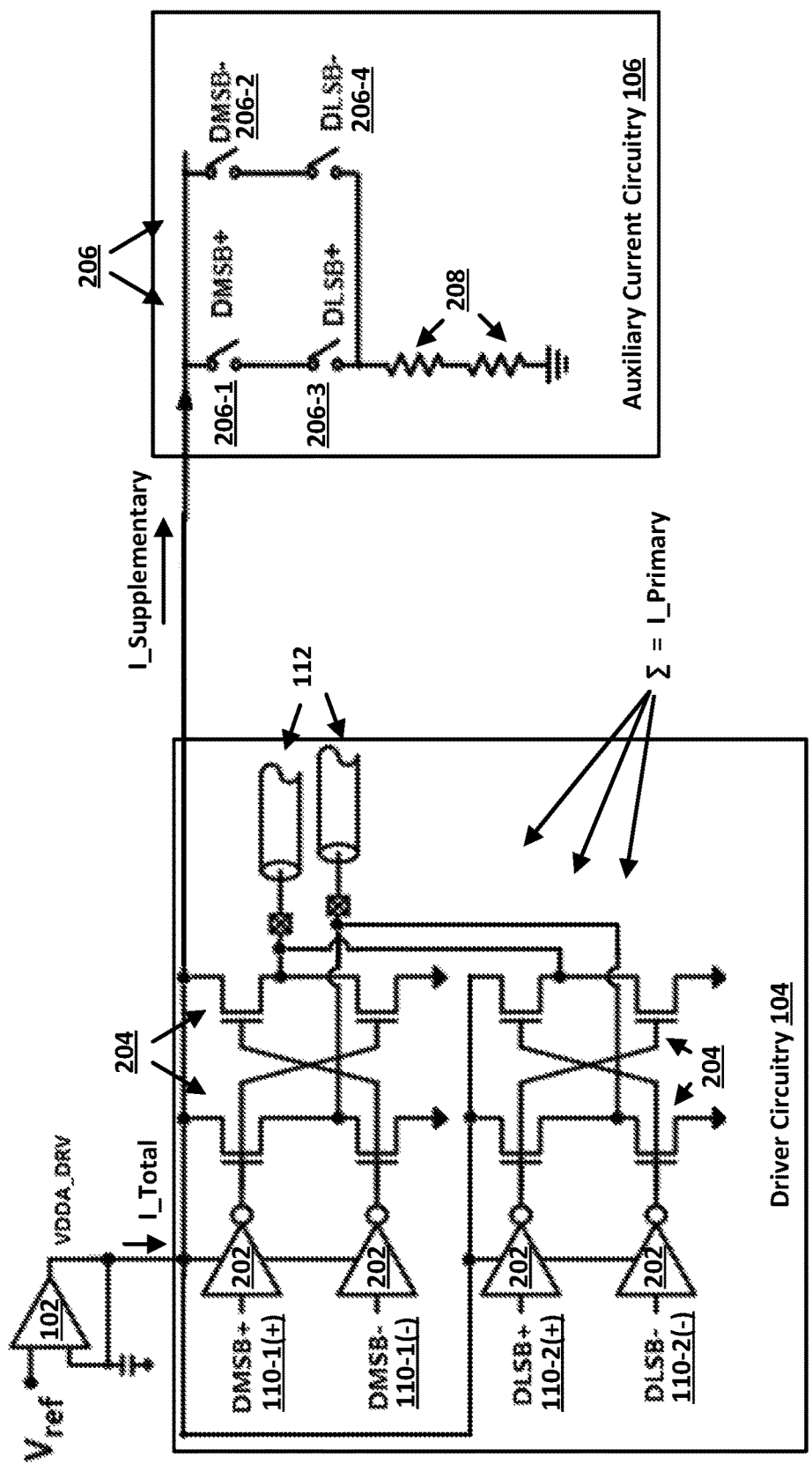
FIG. 2 is a circuit diagram illustrating an example embodiment of the PAM-4 voltage-mode driver shown in FIG. 1, according to some embodiments described herein.
Figure 3:
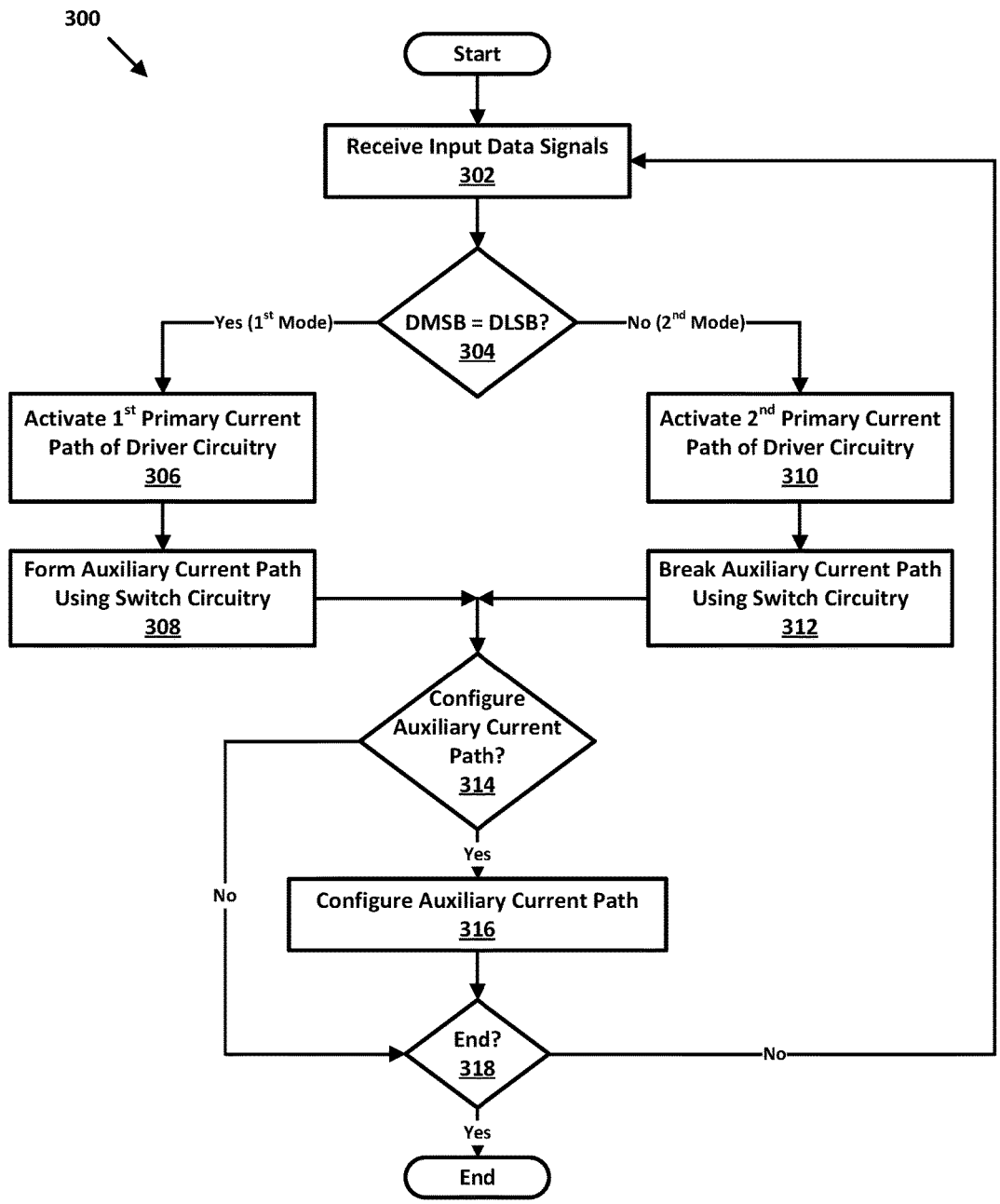
FIG. 3 is a flow diagram of a method for using current compensation to improve the linearity of a PAM-4 voltage-mode driver, in accordance with embodiments of the subject matter of this disclosure.

FIG. 2 is a circuit diagram illustrating a detailed example embodiment of the PAM-4 voltage-mode driver 100 shown in FIG. 1, according to some embodiments described herein. FIG. 3 is a flow diagram of a method 300 for using current compensation to improve the linearity of the PAM-4 voltage-mode driver 100, in accordance with embodiments of the subject matter of this disclosure. The input data ports 110 include a first differential digital input data port 110-1 configured to receive (at block 302) a first input data signal DMSB having a first logic level. With reference to FIG. 2 and FIG. 3, the first differential digital input data port 110-1 includes a first positive terminal 110-1(+) and a first negative terminal 110-1(−) configured to receive (at block 302) the first positive polarity input data signal DMSB+ and the first negative polarity input data signal DMSB−, respectively. In some embodiments, the input data ports 110 also include a second differential digital input data port 110-2 configured to receive (at block 302) a first input data signal DLSB having a second logic level. The second differential digital input data port 110-2 includes a second positive terminal 110-2(+) and a second negative terminal 110-2(−) configured to receive (at block 302) the second positive polarity input data signal DLSB+ and the second negative polarity input data signal DLSB−, respectively.

The signals DMSB+, DMSB−, DLSB+, and DLSB− are cross-coupled to transistors 204, as shown in FIG. 2, by way of respective buffers 202. At block 304, the driver circuitry 104 and the auxiliary current circuitry 106 determine whether the first logic level (DMSB) matches the second logic level (DLSB). In some embodiments, in an additive current mode, when the first logic level of DMSB matches the second logic level of DLSB ("Yes" at block 304), a first primary current path through certain ones of the transistors 204, collectively having a first resistance, is activated (at block 306). In a primary current mode, when the first logic level of DMSB does not match the second logic level of DLSB− ("No" at block 304), a second primary current path through certain ones of transistors 204, collectively having a second resistance, is activated (at block 310). As one of skill in the art would appreciate, activation of the first primary current path or the second primary current path is an inherent attribute of the driver circuitry 104, and the difference between the resistances of the first primary current path and the second primary current path are the result of different ones of the transistors 204 being activated based upon the values of DMSB+, DMSB−, DLSB+, and DLSB−. Because the first resistance is greater than the second resistance, an inherent attribute of the driver circuitry 104, the driver circuitry 104 draws a first amount of current (I_Primary_mode1) from the voltage regulator 102 in the additive current mode and draws a second amount of current (I_Primary_mode2) from the voltage regulator 102 in the primary current mode, with the first amount of current being less than the second amount of current.

The auxiliary current circuitry 106 includes switch circuitry 206 coupled to the first differential digital input port 110-1 and the second differential digital input port 110-2. The switch circuitry 206 determine, at block 304, whether the first logic level of DMSB matches the second logic level DLSB. For example, the switch circuitry 206 may make the determination at block 304 by receiving the DMSB+, DMSB−, DLSB+ and DLSB− signals at the switches, 206-1, 206-2, 206-3, 206-4, respectively, for use as control signals that control the opening and closing of the switches, for example, as shown in the logic table of FIG. 4. Signal paths in FIG. 2 are shown by way of signal names instead of discrete lines, so as not to over-complicate FIG. 2. In various embodiments, the switch circuitry 206 is configured to stabilize a total amount of current (I_Total) drawn from the voltage regulator 102 by: (1) in the additive current mode, in response to determining that the first logic level of DMSB matches the second logic level of DLSB (e.g., DMSB/DLSB=00 or 11) ("Yes" at block 304), forming, at block 308, an auxiliary current path (through certain switches of the switch circuitry 206 and one or more resistors 208), thereby causing supplementary current (I_Supplementary) to flow from the voltage regulator 102 through the auxiliary current path; and (2) in the primary current mode, in response to determining that the first logic level of DMSB does not match the second logic level of DLSB (e.g., DMSB/DLSB=01 or 10) ("No" at block 304), breaking the auxiliary current path at block 312, thereby preventing the supplementary current (I_Supplementary) from flowing from the voltage regulator 102 through the auxiliary current path.

For the purposes of the present disclosure, the first logic level matches the second logic level (referred to herein as the additive current mode) when: (1) both the first logic level and the second logic level are at a logical high or (2) both the first logic level and the second logic level are at a logical low. The first logic level does not match the second logic level (referred to herein as the primary current mode) when: (1) the first logic level is at a logical low and the second logic level is at a logical high or (2) the first logic level is at a logical high and the second logic level is at a logical low.

In some embodiments, the switch circuitry 206 includes a first switch 206-1, a second switch 206-2, a third switch 206-3, and a fourth switch 206-4. The first switch 206-1, the second switch 206-2, the third switch 206-3, and/or the fourth switch 206-4 may, in some cases, be implemented using transistors, such as field effect transistors integrated onto a microchip upon which the driver 100 is formed. The first switch 206-1 is coupled to the first positive terminal 110-1(+) and configured to receive as its control signal the first positive polarity input data signal DMSB+. The second switch 206-2 is coupled to the first negative terminal 110-1(−) and configured to receive as its control signal the first negative polarity input data signal DMSB−. The third switch 206-3 is coupled to the second positive terminal 110-2(+) and configured to receive as its control signal the second positive polarity input data signal DLSB+. The fourth switch 206-4 is coupled to the second negative terminal 110-2(−) and configured to receive as its control signal the second negative polarity input data signal DLSB−. The first switch 206-1 is coupled in series to the third switch 206-3, and the second switch 206-2 is coupled in series to the fourth switch 206-4.

In some embodiments, at block 308, in the additive current mode, the switch circuitry 206 is configured to cause supplementary current (I_Supplementary) to flow from the voltage regulator 102 through the auxiliary current path by: (1) closing the first switch 206-1 and the third switch 206-3 and opening the second switch 206-2 and the fourth switch 206-4, or (2) closing the second switch 206-2 and the fourth switch 206-4 and opening the first switch 206-1 and the third switch 206-3. In such embodiments, the auxiliary current path includes either: (1) the first switch 206-1, the third switch 206-3, and the resistors 208 or (2) the second switch 206-2, the fourth switch 206-4, and the resistors 208.

The one or more of the switches 206 and resistors 208, in some aspects, collectively have a resistance that corresponds to a difference between the first resistance (the resistance that is an inherent attribute of the driver circuitry 104 as described above, based on the certain ones of the transistors 204 of the first primary current path) and the second resistance (the resistance, also an inherent attribute of the driver circuitry 104 as described above, based on the certain ones of the transistors 204 of the second primary current path), thereby causing the supplementary current (I_Supplementary) to be equal (within a tolerance amount) to a difference between (1) the first amount of current (I_Primary_mode1), which the driver circuitry 104 draws from the voltage regulator 102 in the additive current mode, and (2) the second amount of current (I_Primary_mode2), which the driver circuitry 104 draws from the voltage regulator 102 in the primary current mode. As one of skill in the art would appreciate, the resistance of the switches 206 and resistors 208 can be set to a desired amount by selecting component values of the resistors 208, taking into account the on-resistance of the switches 206 indicated by datasheets and/or measurement. For example, I_Primary_mode1 and I_Primary_mode2 can be measured and/or computed based on Kirchhoff's law, and the desired I_Supplementary amount can be computed as the difference between the measured or computed I_Primary_mode1 and I_Primary_mode1. Then, the values of the resistors 208, alone and/or in a series or parallel combination, can be set to an amount that, based on Kirchhoff's law, would result in the desired I_Supplementary. In this manner, for example as shown in FIG. 4, in accordance with embodiments of the subject matter of the present disclosure, the total amount of current (I_Total) drawn from the voltage regulator 102 is stabilized to an amount ($I_2$) that remains the same (within a tolerance amount) for all four possible digital input signal 110 values (and corresponding output voltage levels) of the PAM-4 voltage-mode driver 100.

In some embodiments, at block 312, in the primary current mode, the switch circuitry 206 is configured to selectively prevent the supplementary current (I_Supplementary) from flowing from the voltage regulator 102 through the auxiliary current path by: (1) closing the first switch 206-1 and the fourth switch 206-4 and opening the second switch 206-2 and the third switch 206-3, or (2) closing the second switch 206-2 and the third switch 206-3 and opening the first switch 206-1 and the fourth switch 206-4.

Figure 5:
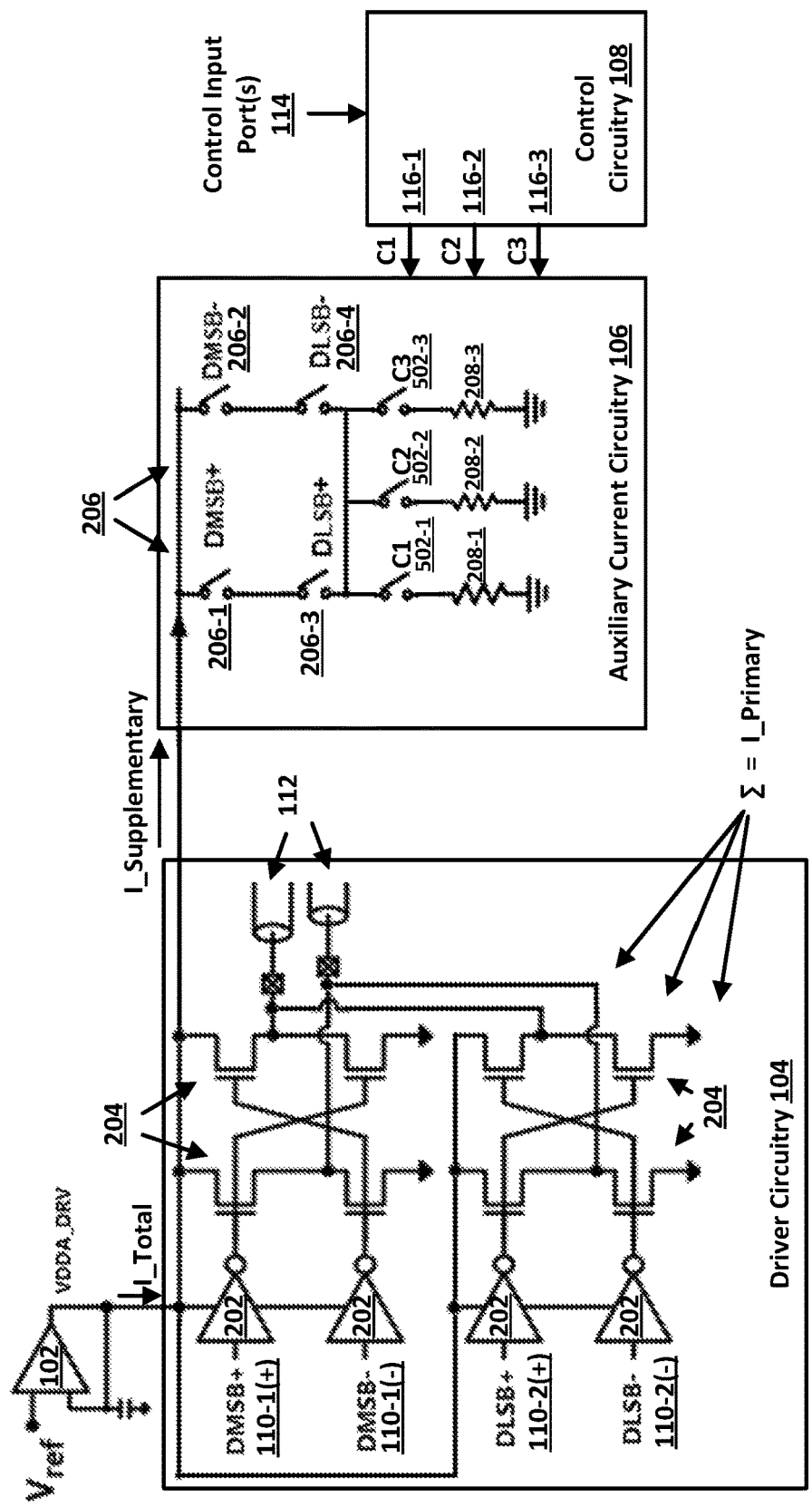
FIG. 5 is a circuit diagram illustrating another example embodiment of the PAM-4 voltage-mode driver shown in FIG. 1, according to some embodiments described herein.

Before continuing to describe the method 300 of FIG. 3, reference will be made to FIG. 5, which is a circuit diagram illustrating another example embodiment of the PAM-4 voltage-mode driver shown in FIG. 1, according to some embodiments. In addition to the components of FIG. 2, FIG. 5 shows the control circuitry 108, having control input ports 114 and control output ports 116-1, 116-2, and 116-3 (collectively, 116). Additionally, the auxiliary current circuitry 106 includes multiple resistors 208-1, 208-2, and 208-3 (collectively, 208) and corresponding resistor switches 502-1, 502-2, and 502-3.

With reference to FIG. 3 and FIG. 5, in some embodiments, at block 314, a determination is made as to whether to configure the auxiliary current path, for example, to fine tune its resistance and thus fine tune the amount of auxiliary current to ensure that the total amount of current (I_Total) drawn from the voltage regulator 102 remains as close to constant for all four possible digital input signal 110 values (and output voltage levels) of the PAM-4 voltage-mode driver. For example, in various embodiments, configuration of the auxiliary current path may occur during a configuration operation at a factory, or upon startup of the device, and/or on the fly during operation. The number of resistors 208 and/or selection of resistors 208 to be activated may be determined in the manner described above, to arrive at an amount of I_Supplementary that is as close as possible to the desired amount indicated above. In some examples, the number of resistors 208 is a programmable variable that is adjustable via a programming or configuration port. If it is determined at block 314 to configure the auxiliary current path ("Yes" at block 314), then control signals C1, C2, C3 are manipulated (e.g., automatically or by an engineer by way of control input ports 114) to close one or more of the resistor switches 502-1, 502-2, 502-3, thereby adding to the auxiliary current path one or more of the resistors 208-1, 208-2, 208-3, respectively, to set a resistance of the auxiliary current path.

Various embodiments discussed in conjunction with FIGS. 1-5 are performed by various electronic components of one or more electronic circuits, such as but not limited to an integrated circuit, application-specific integrated circuit (ASIC), Field Programmable Gate Array (FPGA), and/or other like circuitry. In addition to, or alternatively, various embodiments and components disclosed herein are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

Other variations are within the scope of the following claims.

What is claimed is:

1. A pulse amplitude modulated-4 (PAM-4) voltage-mode driver in which a resistance of a primary current path of the driver varies as a function of respective logic levels of digital data that is input to the driver, the voltage-mode driver comprising:
   switch circuitry that is coupled to a first input data port and a second input data port and that is responsive to respective binary logic levels of a first input data signal input to the first input data port and a second input data signal input to the second input data port, the switch circuitry being configured to:
      in response to the first logic level matching the second logic level, cause supplementary current (I_Supplementary) to flow from a voltage regulator through the auxiliary current path in an additive current mode, and
      in response to the first logic level not matching the second logic level, prevent the supplementary current (I_Supplementary) from flowing from the voltage regulator through the auxiliary current path in a primary current mode.

2. The PAM-4 voltage-mode driver of claim 1, wherein
   the first input data signal comprises a first positive polarity input data signal and a first negative polarity input data signal,
   the second input data signal comprises a second positive polarity input data signal and a second negative polarity input data signal,
   the first input data port comprising a first positive terminal and a first negative terminal configured to receive the first positive polarity input data signal and the first negative polarity input data signal, respectively, and
   the second input data port comprising a second positive terminal and a second negative terminal configured to receive the second positive polarity input data signal and the second negative polarity input data signal, respectively.

3. The PAM-4 voltage-mode driver of claim 2, the switch circuitry comprising:
   a first switch coupled to the first positive terminal and configured to receive the first positive polarity input data signal;
   a second switch coupled to the first negative terminal and configured to receive the first negative polarity input data signal;
   a third switch coupled to the second positive terminal and configured to receive the second positive polarity input data signal; and
   a fourth switch coupled to the second negative terminal and configured to receive the second negative polarity input data signal,
   the first switch being coupled in series to the third switch, and the second switch being coupled in series to the fourth switch, and
   the switch circuitry being configured to cause, in the additive current mode, supplementary current (I_Supplementary) to flow from the voltage regulator through the auxiliary current path by (1) closing the first switch and the third switch and opening the second switch and the fourth switch, or (2) closing the second switch and the fourth switch and opening the first switch and the third switch.

4. The PAM-4 voltage-mode driver of claim 2, the switch circuitry comprising:
   a first switch coupled to the first positive terminal and configured to receive the first positive polarity input data signal;
   a second switch coupled to the first negative terminal and configured to receive the first negative polarity input data signal;
   a third switch coupled to the second positive terminal and configured to receive the second positive polarity input data signal; and
   a fourth switch coupled to the second negative terminal and configured to receive the second negative polarity input data signal,
   the first switch being coupled in series to the third switch, and the second switch being coupled in series to the fourth switch, and
   the switch circuitry being configured to prevent, in the primary current mode, the supplementary current (I_Supplementary) from flowing from the voltage regulator through the auxiliary current path by (1) closing the first switch and the fourth switch and opening the second switch and the third switch, thus breaking a path from the voltage regulator to ground through any of the first switch, second switch, third switch, or fourth switch, or (2) closing the second switch and the third switch and opening the first switch and the fourth switch, thus breaking a path from the voltage regulator to ground through any of the first switch, second switch, third switch, or fourth switch.

5. The PAM-4 voltage-mode driver of claim 2, the switch circuitry comprising:
   a first switch coupled to the first positive terminal and configured to receive the first positive polarity input data signal;
   a second switch coupled to the first negative terminal and configured to receive the first negative polarity input data signal;
   a third switch coupled to the second positive terminal and configured to receive the second positive polarity input data signal; and
   a fourth switch coupled to the second negative terminal and configured to receive the second negative polarity input data signal wherein the first switch, the second switch, the third switch, and the fourth switch respectively comprise transistors.

6. The PAM-4 voltage-mode driver of claim 1, wherein:
   the first logic level is deemed to match the second logic level in the additive current mode when: (1) both the first logic level and the second logic level are at a logical high or (2) both the first logic level and the second logic level are at a logical low, and
   the first logic level is deemed to not match the second logic level in the primary current mode when (1) the first logic level is at a logical low and the second logic level is at a logical high or (2) the first logic level is at a logical high and the second logic level is at a logical low.

7. The PAM-4 voltage-mode driver of claim 1, the auxiliary current path having one or more resistors collectively having a resistance that corresponds to a difference between the first resistance and the second resistance, thereby causing the supplementary current (I_Supplementary) to be equal to a difference between the first amount of current and the second amount of current, within a tolerance amount.

8. The PAM-4 voltage-mode driver of claim 1,
the auxiliary current circuitry further comprising a plurality of resistors and a corresponding plurality of resistor switches that are configured to selectively engage the resistors, and
the PAM-4 voltage-mode driver further comprising control circuitry coupled to the plurality of resistor switches and configured to engage a selectable quantity of resistors to set a resistance of the auxiliary current path to match a difference between a resistance formed on the primary current path during the additive current mode and a resistance formed on the primary current path in the primary current mode.

9. The PAM-4 voltage-mode driver of claim 8, wherein the selectively engaging the resistors includes engaging one or more of the resistors to increase the resistance of the auxiliary current path and decrease the supplementary current (I_Supplementary), or disengaging one or more of the resistors to decrease the resistance of the auxiliary current path and increase the supplementary current (I_Supplementary).

10. The PAM-4 voltage-mode driver of claim 1, further comprising:
a first primary current path; and
a second primary current path,
wherein the first primary current path comprises two first transistors and has a first resistance and is activated in a first mode in response to the first logic level matching the second logic level,
wherein the second primary current path comprises a first sub-path comprising two second transistors and a second sub-path comprising two third transistors, and has a second resistance and is activated in a second mode in response to the first logic level not matching the second logic level, and
wherein the first resistance is greater than the second resistance, thereby causing the driver circuitry to draw a first amount of current from the voltage regulator in the first mode and draw a second amount of current from the voltage regulator in the second mode, the first amount of current being less than the second amount of current.

11. A method for using current compensation to improve the linearity of a pulse amplitude modulated-4 (PAM-4) voltage-mode driver, in which a resistance of a primary current path of the driver varies as a function of respective logic levels of digital data that is input to the driver, the method comprising:
receiving, at a first input data port of PAM-4 driver circuitry, a first input data signal having a first logic level;
receiving, at a second input data port of the driver circuitry, a second input data signal having a second logic level;
in an additive current mode, in response to the first logic level matching the second logic level, using switch circuitry to form an auxiliary current path, thereby causing supplementary current (I_Supplementary) to flow from the voltage regulator through the auxiliary current path; and
in a primary current mode, in response to the first logic level not matching the second logic level, using the switch circuitry to break the auxiliary current path, thereby preventing the supplementary current (I_Supplementary) from flowing from the voltage regulator through the auxiliary current path.

12. The method of claim 11,
wherein the receiving the first input data signal at the first input data port comprises receiving a first positive polarity input data signal and a first negative polarity input data signal of the first input data signal via a first positive terminal and a first negative terminal, respectively, and
wherein the receiving the second input data signal at the second input data port comprises receiving a second positive polarity input data signal and a second negative polarity input data signal of the second input data signal via the second positive terminal and the second negative terminal, respectively.

13. The method of claim 12, further comprising:
receiving the first positive polarity input data signal at a first switch coupled to the first positive terminal;
receiving the first negative polarity input data signal at the second switch coupled to the first negative terminal;
receiving the second positive polarity input data signal at the third switch coupled to the second positive terminal; and
receiving the second negative polarity input data signal at the fourth switch coupled to the second negative terminal, the first switch being coupled in series to the third switch, and the second switch being coupled in series to the fourth switch, and
wherein the using switch circuitry to cause the supplementary current (I_Supplementary) to flow from the voltage regulator through the auxiliary current path of the driver comprises: (1) closing the first switch and the third switch and opening the second switch and the fourth switch, or (2) closing the second switch and the fourth switch and opening the first switch and the third switch.

14. The method of claim 12, further comprising:
receiving the first positive polarity input data signal at a first switch coupled to the first positive terminal;
receiving the first negative polarity input data signal at the second switch coupled to the first negative terminal;
receiving the second positive polarity input data signal at the third switch coupled to the second positive terminal; and
receiving the second negative polarity input data signal at the fourth switch coupled to the second negative terminal, the first switch being coupled in series to the third switch, and the second switch being coupled in series to the fourth switch, and
wherein the using the switch circuitry to prevent the supplementary current (I_Supplementary) from flowing from the voltage regulator through the auxiliary current path comprises: (1) closing the first switch and the fourth switch and opening the second switch and the third switch, thus breaking a path from the voltage regulator to ground through any of the first switch, second switch, third switch, or fourth switch, or (2) closing the second switch and the third switch and opening the first switch and the fourth switch, thus breaking a path from the voltage regulator to ground through any of the first switch, second switch, third switch, or fourth switch.

15. The method of claim 11, wherein the using switch circuitry to form an auxiliary current path comprises selectively switching transistors from an on-mode conducting current therethrough and an off-mode preventing current from being conducted therethrough.

16. The method of claim 11, wherein
the determining that the first logic level matches the second logic level comprises determining that: (1) both the first logic level and the second logic level are at a logical high or (2) both the first logic level and the second logic level are at a logical low, and
the determining that the first logic level does not match the second logic level comprises determining that: (1) the first logic level is at a logical low and the second logic level is at a logical high or (2) the first logic level is at a logical high and the second logic level is at a logical low.

17. The method of claim 11, further comprising selectively engaging in the auxiliary current path one or more resistors collectively having a resistance that corresponds to a difference between the first resistance and the second resistance, thereby causing the supplementary current (I_Supplementary) to be equal to a difference between the first amount of current and the second amount of current, within a tolerance amount.

18. The method of claim 11, further comprising selectively engaging a resistance of the auxiliary current path engaging a selectable quantity of resistors to set a resistance of the auxiliary current path to match a difference between a resistance formed on the primary current path during the additive current mode and a resistance formed on the primary current path in the primary current mode.

19. The method of claim 18, wherein the selectively engaging the resistors includes engaging one or more of the resistors to increase the resistance of the auxiliary current path and decrease the supplementary current (I_Supplementary), or disengaging one or more of the resistors to decrease the resistance of the auxiliary current path and increase the supplementary current (I_Supplementary).

20. The method of claim 18, further comprising:
activating, in the additive current mode, a first primary current path comprising two first transistors and having a first resistance; and
activating, in the primary current mode, a second primary current path comprising a first sub-path comprising two second transistors and a second sub-path comprising two third transistors, and having a second resistance, and
wherein the first resistance is greater than the second resistance, thereby causing a first amount of current to be drawn from the voltage regulator in the additive current mode and a second amount of current to be drawn from the voltage regulator in the primary current mode, the first amount of current being less than the second amount of current.

* * * * *